US007091725B2

United States Patent
Horsky et al.

(10) Patent No.: US 7,091,725 B2
(45) Date of Patent: Aug. 15, 2006

(54) FAST, HIGH-RESOLUTION, INDIRECT MEASUREMENT OF A PHYSICAL VALUE

(75) Inventors: Pavel Horsky, Brno (CZ); Ivan Koudar, Slapanice U Brna (CZ)

(73) Assignee: AMI Semiconductor Belgium BVBA, Oudenaarde (BE)

( * ) Notice: Subject to any disclaimer, the term of this patent is extended or adjusted under 35 U.S.C. 154(b) by 0 days.

(21) Appl. No.: 10/810,340

(22) Filed: Mar. 26, 2004

(65) Prior Publication Data

US 2004/0257091 A1 Dec. 23, 2004

(30) Foreign Application Priority Data

Mar. 28, 2003 (EP) ................... 03447069

(51) Int. Cl.
  *G01R 27/02* (2006.01)
  *G01R 27/08* (2006.01)

(52) U.S. Cl. ................... 324/605; 324/607; 324/691

(58) Field of Classification Search ........ 324/605–611, 324/71.1–71.6, 691; 374/210, 100, 163, 374/170

See application file for complete search history.

(56) References Cited

U.S. PATENT DOCUMENTS

| 3,875,503 | A | * | 4/1975 | Hayashi | ................ 324/607 |
| 4,217,543 | A | * | 8/1980 | Strong | ................ 324/710 |
| 5,655,305 | A | * | 8/1997 | Fletcher | ................ 374/170 |
| 5,700,090 | A | * | 12/1997 | Eryurek | ................ 374/210 |
| 6,140,952 | A | | 10/2000 | Gaboury | ................ 341/145 |
| 6,400,295 | B1 | * | 6/2002 | Van Herzeele | ............ 341/143 |
| 6,598,484 | B1 | * | 7/2003 | Tanizawa | ................ 73/754 |
| 6,870,357 | B1 | * | 3/2005 | Falik | ................ 324/71.5 |
| 2002/0113586 | A1 | * | 8/2002 | Ho et al. | ................ 324/76.29 |

FOREIGN PATENT DOCUMENTS

FR  EP-1102405  * 5/2001

* cited by examiner

*Primary Examiner*—Anjan Deb
*Assistant Examiner*—Jeff Natalini
(74) *Attorney, Agent, or Firm*—Trop, Pruner & Hu, PC

(57) ABSTRACT

A measurement method or system for measuring a physical value comprises, during a same clock cycle, forming an input signal, a reference signal and an offset signal, the input signal including a parasitic value and a useful measurement value. A relationship between the input signal where the parasitic value has been cancelled out, and the reference signal is derived. From this relationship, a value relating to the physical value is determined. The input signal, reference signal and offset signal are respectively associated with an input element, a reference element and a parasitic element. All elements have a common driving signal, and the parasitic value is depending on the common driving signal. The fact that different signals are formed during a same measurement cycle, and that these signals are sufficient to obtain the desired physical value, makes the measurement method or system of the present invention faster than prior art measurement methods or systems: only one conversion cycle is needed against two cycles needed for dual slope analog-to-digital conversion.

19 Claims, 1 Drawing Sheet

FAST, HIGH-RESOLUTION, INDIRECT MEASUREMENT OF A PHYSICAL VALUE

TECHNICAL FIELD OF THE INVENTION

The present invention relates to a method and device for indirect, high resolution and fast measurement of a physical value, such as temperature or pressure for example. A typical application is accurate and fast sensor temperature control, for example in automotive industry, where typically lambda and NOX sensors operate on high and very precisely controlled temperatures. Fast and accurate control loops for such systems are necessary.

BACKGROUND OF THE INVENTION

Standard methods for measuring a physical value use measuring of a characteristic parameter of a sensing device, which characteristic parameter is dependent on the physical value to be measured. For example, for measuring a temperature or pressure, a resistance of a temperature or pressure dependent sensing element may be measured by measuring current through or voltage over a sensing element. The accuracy of the measurement is proportional to the accuracy of a reference voltage or reference current and to the accuracy of the sensing element.

Most known standard methods use analog-to-digital conversion based on a dual slope integration method, which makes the conversion speed slower.

For example U.S. Pat. Nos. 3,875,503 and 4,217,543 both describe a principle using a dual slope integration cycle. This means that two integration frames are needed for getting the desired result.

In U.S. Pat. No. 3,875,503 an integrator first integrates an unknown analog signal for a predetermined time period and then integrates a reference signal of inverse polarity with respect to the analog signal until the integrator is restored to its initial value. Digital counting means digitally measure a time interval ending when the integrating means-is restored to its initial value.

In U.S. Pat. No. 4,217,543, during a first cycle, a voltage drop over a reference resistor is integrated, and during a second cycle, a voltage drop over a sensing resistor is integrated.

In U.S. Pat. No. 5,655,305, the sensing element is a part of a bridge resistor network. The analog-to-digital converter is again using a dual slope integration method.

In EP-1102405 use is made of a three-port sigma-delta modulator having an input port, a reference port and an offset port. Only one conversion cycle is used for evaluating an unknown resistance value. A bridge topology is used for the sensor, from which a differential signal to be fed to the input port is derived. A differential signal driving the reference port is derived as a fraction of the bridge supply voltage to make accuracy of the measurement independent on it. An input at the offset port is used to indirectly correct the sensor (bridge) offset: the offset voltage must be determined before the measurement cycle.

If a parasitic resistance is present in any of the above measurement devices, such as a parasitic resistance due to a sensing element boding contact for example, then this cannot be remedied.

SUMMARY OF THE INVENTION

It is an object of the present invention to provide means for indirect measurement of a physical value with high speed and high resolution, by means of a sensing element, which means provides the possibility of cancelling out parasitic resistance of a sensing element.

It is another object of the present invention to provide means for indirect measurement of a physical value without using a reference current or reference voltage element.

The above objectives are accomplished by a method and device or system according to the present invention.

A measurement method for measuring a physical value according to the present invention comprises during a clock cycle: forming an input signal, a reference signal and an offset signal, the input signal including a parasitic value and a useful measurement value, deriving a relationship between the input signal, from which the parasitic value has been cancelled out, and the reference signal, and from this relationship, determining a value relating to the physical value. The forming step is preferably carried out within one clock cycle. The input signal, reference signal and offset signal are respectively associated with an input element, a reference element and a parasitic element. All elements have a common driving signal, and the parasitic value is depending on the common driving signal. The fact that different signals are formed during a same measurement cycle, and that these signals are sufficient to obtain the desired physical value, makes the measurement method of the present invention faster than prior art measurement methods: only one conversion cycle is needed against two cycles needed for dual slope analog-to-digital conversion.

The input signal may be a first voltage. This first voltage may be obtained from a direct voltage drop over the sensing element, such as a sensing resistor for example. Alternatively, the input signal may be a first current.

The reference signal may be a second voltage. This second voltage may be obtained from a direct voltage drop over the reference element, such as a reference resistor for example. Alternatively, the reference signal may be a second current.

The offset signal may be a third voltage. This third voltage may be obtained from a direct voltage drop over the parasitic element, such as a parasitic contact resistance of the sensing element for example.

The common driving signal may be a current. Alternatively, the common driving signal may be a voltage.

The physical value measured may e.g. include any of a temperature, a pressure, a light intensity, a position, for example a linear or angular position.

The present invention also provides a measurement system for indirect measurement of a physical value. This measurement system comprises:

an analog-to-digital converter with at least a first, a second and a third port or data input terminal, each of the at least three ports being suitable for receiving an input signal from an element, the analog-to-digital converter being suitable for evaluating the physical value in one measurement cycle, a sensing element having a pre-defined characteristic parameter related to the physical value to be measured, being coupled to the first port for applying an input signal to said first port, a reference element being coupled to the second port for applying a reference signal to the second port, an element corresponding to a parasitic value of the sensing element, being coupled to the third port for applying a parasitic value of the sensing element to the third port, means for deriving a relationship between the input signal, from which the parasitic value of sensing element has been cancelled out, and the reference signal, and means for deriving, from the relationship, a value relating to the physical value.

Using an analog-to-digital converter with at least three ports, e.g. a sigma-delta converter, the physical value to be measured can be evaluated in only one conversion cycle. No switching is needed. This results in fast and high-resolution measurement of the physical value. The measuring cycle is faster than prior art measuring cycles; there is one conversion cycle against two cycles needed for dual slope analog-to-digital conversion. Furthermore, by using a three-port analog-to-digital converter, the present invention also solves the problem of cancelling out a sensing element parasitic value.

The means for deriving a relationship between the input signal and the reference signal may be part of the analog-to-digital converter. The means for deriving, from the relationship, a value relating to the physical value may be a computation unit; either a dedicated computation means for deriving said value, or a general purpose computation means being programmed for deriving said value relating to the physical value. The dedicated computation means may be any suitable device such as a microprocessor or a programmable logic device (sometimes referred to as PAL, PLA, FPLA, PLD, EPLD, EEPLD, LCA or FPGA), which are well-known integrated circuits that provide the advantages of fixed integrated circuits with the flexibility of custom integrated circuits. Such devices allow a user to electrically program standard, off-the-shelf logic elements to meet a user's specific needs, in this case to derive, from the relationship, the value relating to the physical value.

The reference element may be coupled in series with the sensing element. The element corresponding to a parasitic value of the sensing element may be coupled in series with the sensing element. Alternatively, depending on the common driving signal, the reference element and the element corresponding to a parasitic value of the sensing element may be coupled in parallel with the sensing element.

The analog-to-digital converter may comprise a sigma-delta converter. This results in high resolution. Generally sigma-delta offers higher resolution compared to dual slope ADC in case of the same conversion cycle time.

The sensing element is a device with a defined coefficient relating a characteristic of the sensing element to the physical value to be measured, for example having a well-defined resistance temperature coefficient. The sensing element may comprise a sensing resistor. The reference element may comprise a reference resistor, preferably a precise resistor. The element corresponding to a parasitic value of the sensing element may comprise a sensing element parasitic resistance.

The above system according to the present invention is a simple and robust implementation.

The physical value measured may e.g. be any of a temperature, a pressure, a light intensity, a position, for example a linear or angular position.

In the above method and system, no reference current or voltage is needed, contrary to dual slope analog-to-digital conversion. Final accuracy is proportional only to the reference element accuracy and not on any other reference current or reference voltage.

These and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

DESCRIPTION OF ILLUSTRATIVE EMBODIMENTS

Figure 1:
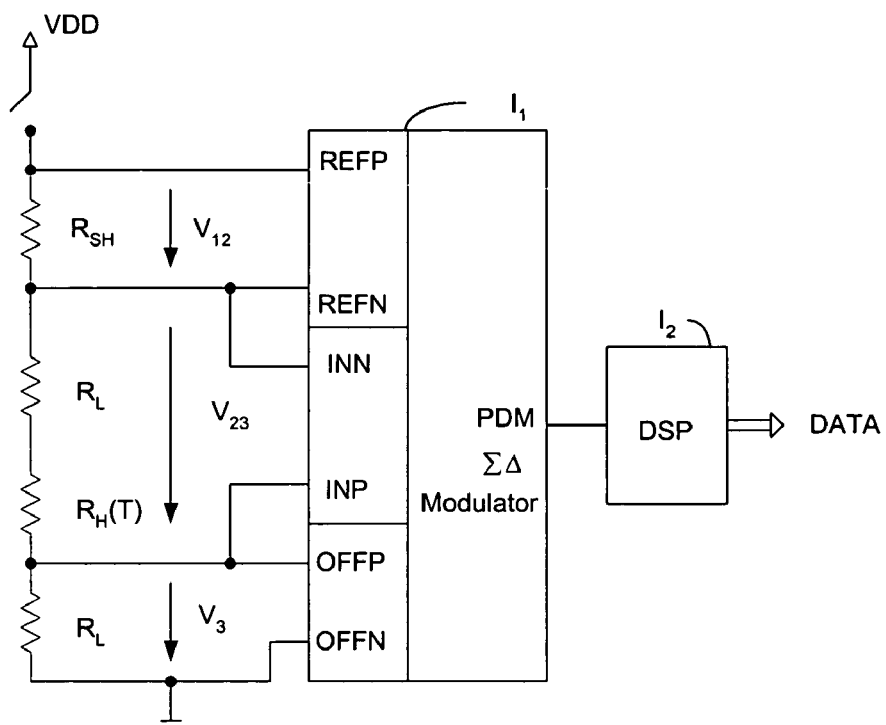
FIG. 1 is a schematic illustration of a measurement device according to a first embodiment of the present invention, applied to a three-terminal temperature sensitive resistor.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

Furthermore, the terms first, second and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter. Thus, the scope of the expression "a device comprising means A and B" should not be limited to devices consisting only of components A and B. It means that with respect to the present invention, the only relevant components of the device are A and B.

Similarly, it is to be noticed that the term "coupled", also used in the claims, should not be interpreted as being restricted to direct connections only. Thus, the scope of the expression "a device A coupled to a device B" should not be limited to devices or systems wherein an output of device A is directly connected to an input of device B. It means that there exists a path between an output of A and an input of B which may be a path including other devices or means.

The core of the invention is a structure which can, in one conversion cycle, process a relationship between a signal input of which is cancelled out a parasitic value, and a reference voltage input. This process can for example be used in indirect temperature or pressure measurement. The detailed description is given for indirect temperature measurement, but the invention includes indirect measurement of any suitable physical value. During measurement, the value of the physical value is directly converted into a digital signal DATA.

FIG. 1 illustrates a measurement device according to a first embodiment of the present invention, and arranged to obtain a digital signal DATA representing a temperature measured by a three-terminal temperature-sensitive resistance $R_H(T)$. Three-terminal temperature-sensitive resistances are most often used in temperature sensors.

The part of the measurement device indicated with I1 is a three-port analog-to-digital converter suitable for calculating $$\frac{V_A - V_B}{V_C},$$

$V_A$, $V_B$ and $V_C$ being signals at the input ports of the three-port analog-to-digital converter. Any analog-to-digital converter making use of samples can be used, for example a sigma-delta converter, a pipeline converter or a successive approximation converter. A three-port sigma-delta analog-to-digital converter can for example be prepared in an easy way to do this. This analog-to-digital converter has an input port comprising a positive input terminal INP and a negative input terminal INN, a reference port comprising a positive reference terminal REFP and a negative reference terminal REFN, and an offset port comprising a positive offset terminal OFFP and a negative offset terminal OFFN. The three-port analog-to-digital converter, for example the sigma-delta converter, may be of a well known conventional design.

A differential signal input $V_{23}$ is applied between the input terminals INP and INN. A differential reference voltage input signal $V_{12}$ is applied between the reference terminals REFP and REFN. A differential offset voltage input signal is applied between the offset terminals OFFP and OFFN.

The above differential voltages applied between the terminals of the sigma-delta converter may be obtained as follows. A reference element, for example a precise reference resistor $R_{SH}$, such as e.g. RN-776-476 obtainable from MultiComp, 8E160D-341-897 obtainable from Philips or RCC55 obtainable from Welwyn for example, may be connected between the reference terminals REFP and REFN. A sensing element, for example a temperature-dependent resistor $R_H(T)$, such as e.g. PT100 obtainable from Calibration, ElAxxxx obtainable from Siemens, Germany or YGAxxxTB obtainable from Philips, Holland for example, may be connected between the input terminals INP and INN. An element emulating a parasitic value of the sensing element $R_H(T)$, for example a parasitic contact resistance $R_L$ of the sensing element, may be connected between the offset terminals OFFP and OFFN. There is counted on the fact that the parasitic contact resistance $R_L$ of the sensing element $R_H(T)$ is measured at one side, which is possible in view of the third terminal of the sensing resistor, and is subtracted from the other side.

There is a common drive element between the reference element $R_{SH}$ and the sensing element $R_H(T)$. in the present case both have a common current flowing through them, and each generates a voltage value depending on its resistance value.

During a measurement cycle, the switch to VDD is closed. Voltage drops $V_{12}$, $V_{23}$ and $V_3$ are fed to the sigma-delta differential inputs as shown in FIG. 1.

It can be derived that:

$$\frac{V_{12}}{R_{SH}} \overset{(a)}{=} \frac{V_{23}}{R_L + R_H} = \frac{V_3}{R_L} \overset{(b)}{=} \frac{V_{12}}{R_{SH}} \qquad \text{eq. (1)}$$

-continued $$(b) \Rightarrow R_L = \frac{V_3}{V_{12}} R_{SH}$$

$$(a) \Rightarrow \frac{V_{12}}{R_{SH}} = \frac{V_{23}}{\frac{V_3}{V_{12}} R_{SH} + \frac{R_H}{V_{12}} V_{12}}$$

$$\Rightarrow \frac{1}{R_{SH}} = \frac{V_{23}}{V_3 R_{SH} + R_H V_{12}}$$

$$\Rightarrow R_{SH}(V_{23} - V_3) = R_H V_{12}$$

$$\Rightarrow R_H = \frac{V_{23} - V_3}{V_{12}} R_{SH}$$

Eq. (1) is directly processed during one integration or conversion cycle. Instead of a standard sequence of three voltage measurement conversion cycles using a reference voltage, only one cycle is used and no reference voltage is involved.

It is clear that a ratio measurement is done, and since this is done in one cycle, it is not sensitive to variations, for example of supply, between cycles.

From the known function $R_H = f(T)$, i.e. from the known $R_H$ temperature coefficients, the real temperature can easily be calculated.

The output of the sigma-delta analog-to-digital converter I1 is a pulse density modulated signal PDM. This signal PDM is applied to a digital signal processing (DSP) block 12. This block is suitable for processing the input PDM signal to an output digital word DATA. This digital word DATA carries the indirect temperature information.

Figure 2:
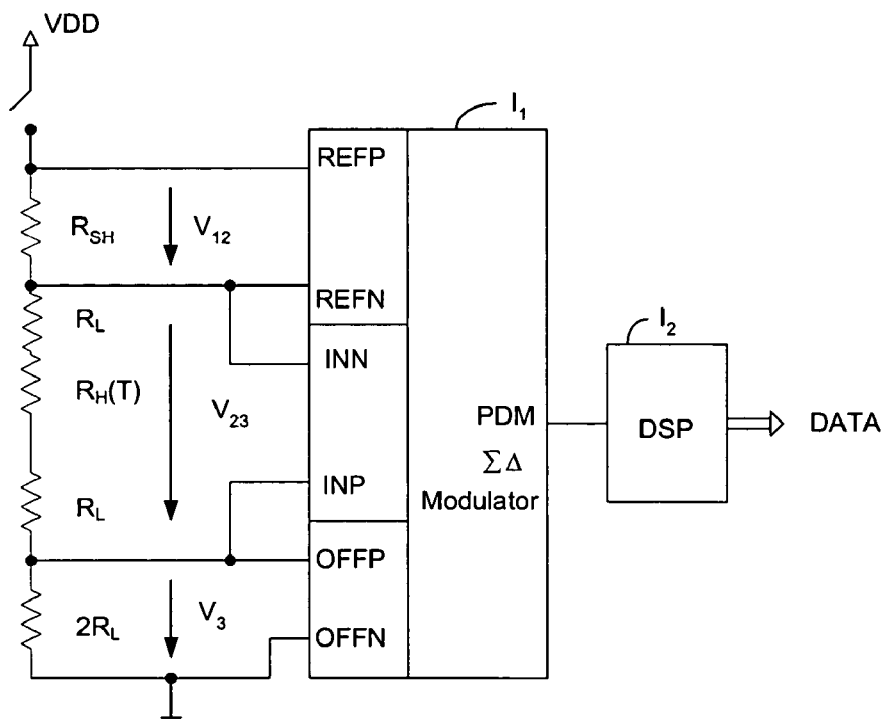
FIG. 2 is a schematic illustration of a measurement device according to a second embodiment of the present invention, applied to a two-terminal temperature sensitive resistor.

FIG. 2 illustrates a measurement device according to a second embodiment of the present invention, and arranged to obtain a digital signal DATA representing a temperature measured by a two-terminal temperature-sensitive resistance $R_H(T)$.

The part of the measurement device indicated with I1 is a three-port analog-to-digital converter suitable for calculating $$\frac{V_A - V_B}{V_C},$$

$V_A$, $V_B$ and $V_C$ being signals at the input ports of the three-port analog-to-digital converter. As described with respect to FIG. 1, any three-port analog-to-digital converter making use of samples can be used. The three-port analog-to-digital converter may be of a conventional design. The analog-to-digital converter used has an input port comprising a positive input terminal INP and a negative input terminal INN, a reference port comprising a positive reference terminal REFP and a negative reference terminal REFN, and an offset port comprising a positive offset terminal OFFP and a negative offset terminal OFFN.

A differential signal input $V_{23}$ is applied between the input terminals INP and INN. A differential reference voltage input signal $V_{12}$ is applied between the reference terminals REFP and REFN. A differential offset voltage input signal is applied between the offset terminals OFFP and OFFN.

The above differential voltages applied between the terminals of the sigma-delta converter may be obtained as follows. A reference element, for example a precise reference resistor $R_{SH}$, such as e.g. RN-776-476 obtainable from MultiComp, 8E160D-341-897 obtainable from Philips or RCC55 obtainable from Welwyn, may be connected between the reference terminals REFP and REFN. A sensing element, for example a temperature-dependent resistor $R_H(T)$, such as e.g. PT100 obtainable from Calibration, EIAxxxx obtainable from Siemens, Germany or YGA-xxxTB obtainable from Philips, Holland for example, may be connected between the input terminals INP and INN. An element emulating a parasitic value of the sensing element $R_H(T)$, for example a resistor equal to twice a parasitic contact resistance $R_L$ of the sensing element, may be connected between the offset terminals OFFP and OFFN.

During a measurement cycle, the switch to VDD is closed. Voltage drops $V_{12}$, $V_{23}$ and $V_3$ are fed to the sigma-delta differential inputs as shown in FIG. 1.

It can be derived that:

$$\frac{V_{12}}{R_{SH}} \stackrel{(a)}{=} \frac{V_{23}}{R_L + R_H + R_L} = \frac{V_3}{2R_L} \stackrel{(b)}{=} \frac{V_{12}}{R_{SH}} \qquad \text{eq. (2)}$$

$$(b) \Rightarrow 2R_L = \frac{V_3}{V_{12}} R_{SH}$$

$$(a) \Rightarrow \frac{V_{12}}{R_{SH}} = \frac{V_{23}}{\frac{V_3}{V_{12}} R_{SH} + \frac{R_H}{V_{12}} V_{12}}$$

$$\Rightarrow \frac{1}{R_{SH}} = \frac{V_{23}}{V_3 R_{SH} + R_H V_{12}}$$

$$\Rightarrow R_{SH}(V_{23} - V_3) = R_H V_{12}$$

$$\Rightarrow R_H = \frac{V_{23} - V_3}{V_{12}} R_{SH}$$

Eq. (2) is obtained, which is equal to Eq. (1), and again this equation is directly processed during one integration or conversion cycle. Instead of a standard sequence of three voltage measurement conversion cycles using a reference voltage, only one cycle is used and no reference voltage is involved.

From the known function $R_H=f(T)$, i.e. from the known $R_H$ temperature coefficients, the real temperature can easily be calculated.

The output of the sigma-delta analog-to-digital converter I1 is a pulse density modulated signal PDM. This signal PDM is applied to a digital signal processing (DSP) block 12. This block is suitable for processing the input PDM signal to an output digital word DATA. This digital word DATA carries the indirect temperature information.

In any of all of the above embodiments a means for deriving a relationship between an input signal and the reference signal may be part of the analog-to-digital converter. From the relationship, a value relating to the physical value may be computed using a computation unit; either a dedicated computation means for deriving said value, or a general purpose computation means being programmed for deriving said value relating to the physical value. The dedicated computation means may be any suitable device such as a microprocessor or a programmable logic device (sometimes referred to as PAL, PLA, FPLA, PLD, EPLD, EEPLD, LCA or FPGA), which are well-known integrated circuits that provide the advantages of fixed integrated circuits with the flexibility of custom integrated circuits. Such devices allow a user to electrically program standard, off-the-shelf logic elements to meet a user's specific needs, in this case to derive, from the relationship, the value relating to the physical value.

Main differences with respect to prior art are the use of a three-port analog-to-digital converter, and a simple series resistor net instead of a resistor bridge net. In comparison to prior art, using the offset port, the parasitic resistance of the sensing resistor can be cancelled out. This is a significant advantage over prior art solutions. Such feature is appreciated especially for accurate temperature control of low ohmic sensors. Next dominant difference is using sigma-delta analog-to-digital converter type. To get the result, the system only needs one integration cycle, instead of two which are needed in dual slope analog-to-digital converter systems used in prior art solutions. This feature speeds up the temperature measurement, or more generally the measurement of the physical value, typically by a factor two against the dual slope analog-to-digital converter type.

A limiting factor is the ratio $$\frac{V_{23} - V_3}{V_{12}},$$

which must be in the range of 0 to 1, e.g. typically 0.9 to achieve a required resolution e.g. of 12 bits for a sigma-delta analog-to-digital converter (mainly due to intrinsic sigma-delta signal to noise ratio characteristics).

It is to be understood that although preferred embodiments, specific constructions and configurations, have been discussed herein for devices according to the present invention, various changes or modifications in form and detail may be made without departing from the scope and spirit of this invention. For example, the above principle can be used in any application requiring fast and high resolution measurement of a physical value, where a sensing element having defined characteristics related or proportional to such measured physical value is a potential candidate for using this principle.

The invention claimed is:

1. A measurement method for measuring a physical value, comprising during one clock cycle: forming an input signal, a reference signal and an offset signal, the input signal including a parasitic value and a useful measurement value, the signals being respectively associated with an input element, a reference element and a parasitic element, all these elements being coupled in a same current or voltage path, thus having a common driving signal of a same value, the parasitic value depending on the common driving signal, and deriving a relationship between the input signal, from which the parasitic value has been cancelled out, and the reference signal, and from this relationship, determining a value relating to the physical value.

2. A measurement method according to claim 1, wherein the input signal is a first voltage.

3. A measurement method according to claim 2, wherein the first voltage is obtained from a direct voltage drop over the sensing element.

4. A measurement method according to claim 2, wherein the reference signal is a second voltage.

5. A measurement method according to claim 2, wherein the offset signal is a third voltage.

6. A measurement method according to claim 1, wherein the reference signal is a second voltage.

7. A measurement method according to claim 6, wherein the second voltage is obtained from a direct voltage drop over the reference element.

8. A measurement method according to claim 6, wherein the offset signal is a third voltage.

9. A measurement method according to claim 1, wherein the reference element is a reference resistor.

10. A measurement method according to claim 1, wherein the offset signal is a third voltage.

11. A measurement method according to claim 10, wherein the third voltage is obtained from a direct voltage drop over the parasitic element.

12. A measurement method according to claim 1, wherein the physical value includes any of temperature, a pressure, a light intensity, a position.

13. A measurement method according to claim 1, wherein the input signal, the reference signal and the offset signal are fed to a digital-to-analog converter with at least a first, a second and a third port.

14. A measurement system for indirect measurement of a physical value, comprising
- an analog-to-digital converter with at least a first, a second and a third port, each of the at least three ports being suitable for receiving an input signal from an clement, the analog-to-digital converter being suitable for evaluating the physical value in one measurement cycle,
- a sensing element having a pre-defined characteristic parameter related to the physical value to be measured, being coupled to the first port for applying an input signal to said first port,
- a reference element being coupled to the second port for applying a reference signal to the second port,
- an element corresponding to a parasitic value of the sensing element, being coupled to the third port for applying a parasitic value of the sensing element to the third port, the element, the sensing element and the reference element being coupled in a same current or voltage path, thus having a common driving signal of a same value,
- means for deriving a relationship between the input signal, from which the parasitic value of sensing element has been cancelled out, and the reference signal, and
- means for deriving, from the relationship, a value relating to the physical value.

15. A measurement system according to claim 14, wherein the reference element is coupled in series with the sensing element.

16. A measurement system according to claim 15, wherein the element corresponding to a parasitic value of the sensing element is coupled in series with the sensing element.

17. A measurement system according to claim 14, wherein the element corresponding to a parasitic value of the sensing element is coupled in series with the sensing element.

18. A measurement system according to claim 14, wherein the reference element comprises a reference resistor.

19. A measurement system according to claim 14, wherein the physical value is any of a temperature, a pressure, a light intensity, a position.

* * * * *

UNITED STATES PATENT AND TRADEMARK OFFICE
CERTIFICATE OF CORRECTION

PATENT NO. : 7,091,725 B2 Page 1 of 1
APPLICATION NO. : 10/810340
DATED : August 15, 2006
INVENTOR(S) : Pavel Horsky and Ivan Koudar It is certified that error appears in the above-identified patent and that said Letters Patent is hereby corrected as shown below:

Column 9:
Line 19, "clement" should be --element--.

Signed and Sealed this

Thirty-first Day of October, 2006

JON W. DUDAS
*Director of the United States Patent and Trademark Office*